United States Patent
Chen

(10) Patent No.: US 11,322,551 B2
(45) Date of Patent: May 3, 2022

(54) DISPLAY PANEL AND DISPLAY DEVICE

(71) Applicant: BOE Technology Group Co., Ltd., Beijing (CN)

(72) Inventor: Yipeng Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 126 days.

(21) Appl. No.: 16/830,679

(22) Filed: Mar. 26, 2020

(65) Prior Publication Data

US 2021/0020706 A1    Jan. 21, 2021

(30) Foreign Application Priority Data

Jul. 15, 2019    (CN) .......................... 201910636945.5

(51) Int. Cl.
*H01L 27/32*    (2006.01)
*H01L 51/52*    (2006.01)

(52) U.S. Cl.
CPC ...... *H01L 27/3218* (2013.01); *H01L 27/3227* (2013.01); *H01L 27/3276* (2013.01); *H01L 51/5234* (2013.01); *H01L 2227/323* (2013.01); *H01L 2251/308* (2013.01)

(58) Field of Classification Search
CPC ... H01L 27/3225–3234; H01L 27/3244–3279; H01L 27/3281–329
See application file for complete search history.

(56) References Cited

U.S. PATENT DOCUMENTS

2005/0093767 A1    5/2005    Lu et al.
2006/0061524 A1    3/2006    Suh et al.
2020/0258967 A1*   8/2020    Kim ...................... H01L 27/326

FOREIGN PATENT DOCUMENTS

| CN | 108922900 A | 11/2018 |
| CN | 108986678 A | 12/2018 |
| CN | 109545833 A | 3/2019 |
| KR | 20060019758 A | 3/2006 |

OTHER PUBLICATIONS

Office Office Action for corresponding Chinese Application No. 201910636945.5 dated Feb. 7, 2021.

* cited by examiner

*Primary Examiner* — Daniel P Shook
(74) *Attorney, Agent, or Firm* — ArentFox Schiff LLP; Michael Fainberg

(57) ABSTRACT

The present disclosure discloses a display panel and a display device. The display device includes a first display area and a second display area, where the first display area includes a plurality of first sub-pixel units, and each of the first sub-pixel units includes a first light emitting device and a driving circuit for driving the first light emitting device to emit light; where the second display area includes a plurality of second sub-pixel units and a plurality of first voltage signal lines, each of the second sub-pixel units includes a second light emitting device, and the first voltage signal lines are directly and electrically connected to anodes of the second light emitting devices.

10 Claims, 7 Drawing Sheets

DISPLAY PANEL AND DISPLAY DEVICE

The present application claims the priority from Chinese Patent Application No. 201910636945.5, filed with the Chinese Patent Office on Jul. 15, 2019, and entitled "DISPLAY PANEL AND DISPLAY DEVICE", which is hereby incorporated by reference in its entirety.

FIELD

The present disclosure relates to the technical field of display and in particular to a display panel and a display device.

BACKGROUND

At present, a display panel designed to have a full screen is more and more popular to consumers, and the full screen has become a main way of mobile phone display and compressed a design space of devices such as a camera, an infrared sensor and an earphone. A main means for achieving the full screen is to arrange the devices such as the camera and the infrared sensor under a display screen. In order to realize full screen display as soon as possible, an area of a display screen corresponding to the devices such as the camera and the infrared sensor is also required to be displayed, however, the overall transmittance in the area is relatively low in the prior art.

SUMMARY

An embodiment of the present disclosure provides a display panel, including a first display area and a second display area, where the first display area includes a plurality of first sub-pixel units, where each of the first sub-pixel units includes a first light emitting device and a driving circuit for driving the first light emitting device to emit light; where the second display area includes a plurality of second sub-pixel units and a plurality of first voltage signal lines, where each of the second sub-pixel units includes a second light emitting device, and the first voltage signal lines are directly and electrically connected to anodes of the second light emitting devices.

Optionally, during specific implementation, in the above-mentioned display panel provided by the embodiment of the present disclosure, a pixel density of the first sub-pixel units is larger than that of the second sub-pixel units.

Optionally, during specific implementation, in the above-mentioned display panel provided by the embodiment of the present disclosure, the plurality of second sub-pixel units constitute a plurality of sub-display areas, and a light transmitting area is arranged between every two adjacent sub-display areas.

Optionally, during specific implementation, in the above-mentioned display panel provided by the embodiment of the present disclosure, the first display area further includes a plurality of second voltage signal lines, and the second voltage signal lines are electrically connected to anodes of the first light emitting devices through the driving circuits;

where the second display area includes an anode layer, a light emitting functional layer and a cathode layer stacked in sequence; the anode layer includes a plurality of first strip electrodes extending in a first direction and being arranged in a second direction, and the cathode layer includes a plurality of second strip electrodes extending in the second direction and being arranged in the first direction; overlapped areas of the first strip electrodes, the light emitting functional layer and the second strip electrodes constitute the second light emitting devices; parts, arranged in the overlapped areas, in the anode layer, serve as the anodes of the second light emitting devices, and non-overlapped parts in the anode layer serve as the first voltage signal lines; parts, arranged in the overlapped areas, in the cathode layer, serve as cathodes of the second light emitting devices, and non-overlapped parts in the cathode layer serve as voltage signal lines of the cathode layer; and the cathode layer is made of a transparent conductive material.

Optionally, during specific implementation, in the above-mentioned display panel provided by the embodiment of the present disclosure, the transparent conductive material is indium zinc oxide (IZO).

Optionally, during specific implementation, in the above-mentioned display panel provided by the embodiment of the present disclosure, the anode layer is made of indium tin oxide (ITO) or Ag.

Optionally, during specific implementation, in the above-mentioned display panel provided by the embodiment of the present disclosure, a shape of the second display area includes any one or a combination of a round, an ellipse or a square.

Correspondingly, an embodiment of the present disclosure further provides a display device including any one of the above-mentioned display panels provided by the embodiment of the present disclosure.

Optionally, during specific implementation, the above-mentioned display device provided by the embodiment of the present disclosure further includes a first driving IC electrically connected to the first voltage signal lines and a second driving IC electrically connected to second voltage signal lines, where the first driving IC is configured to directly input current signals to the anodes of second light emitting devices through the first voltage signal lines, and the second driving IC is configured to input current signals to anodes of first light emitting devices sequentially through the second voltage signal lines and the driving circuits.

Optionally, during specific implementation, in the above-mentioned display device provided by the embodiment of the present disclosure, the first driving IC and the second driving IC are arranged at two opposite sides of the display panel.

Optionally, during specific implementation, the above-mentioned display device provided by the embodiment of the present disclosure further includes a sensor module, where the sensor module is arranged in the second display area of the display panel and is arranged at a backlight side of the display panel, and a photosensitive surface of the sensor module faces the display panel.

DETAILED DESCRIPTION OF THE EMBODIMENTS

In order to make objectives, technical solutions and advantages of the present disclosure clearer, specific implementation ways of a display panel and a display device provided by the embodiments of the present disclosure are described in detail below in conjunction with accompanying drawings. It should be understood that the preferred embodiments described below are merely intended to illustrate and explain the present disclosure, rather than to limit the present disclosure. The embodiments in this application and features in the embodiments can be mutually combined without conflicts. It should be noted that the thickness and shape of each layer of film in the accompanying drawings do not reflect the real scale of the display panel, and are merely to illustrate the contents of the present disclosure. Moreover, same or similar numerals throughout indicate same or similar elements or elements with same or similar functions.

The present disclosure is described below in detail in conjunction with the accompanying drawings. It should be noted that the embodiments are intended to better understand the present disclosure, rather than to limit the present disclosure.

Figure 1:
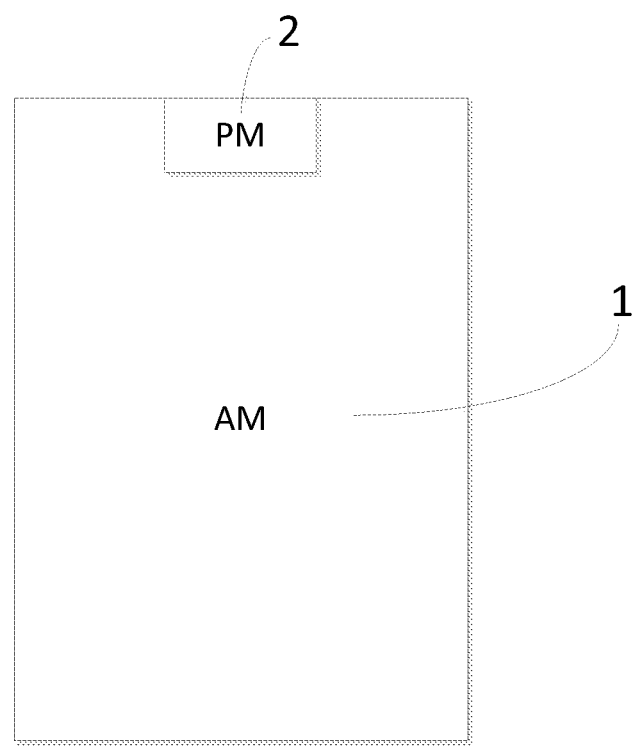
FIG. 1 is a schematic structural diagram of a display panel provided by an embodiment of the present disclosure.
Figure 2:
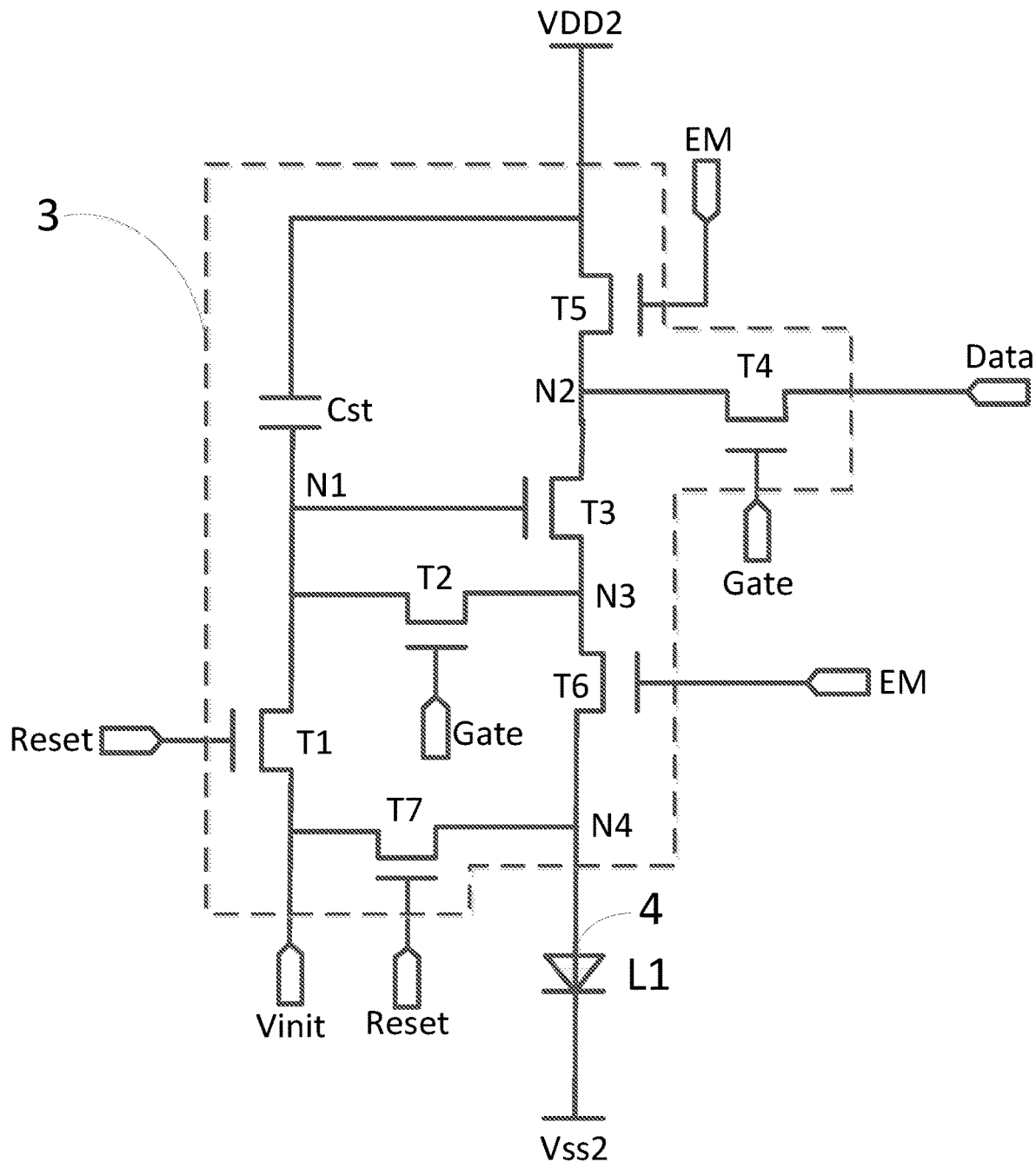
FIG. 2 is a schematic structural diagram of a driving circuit and a first light emitting device of a first sub-pixel unit in a first display area provided by an embodiment of the present disclosure.
Figure 3:
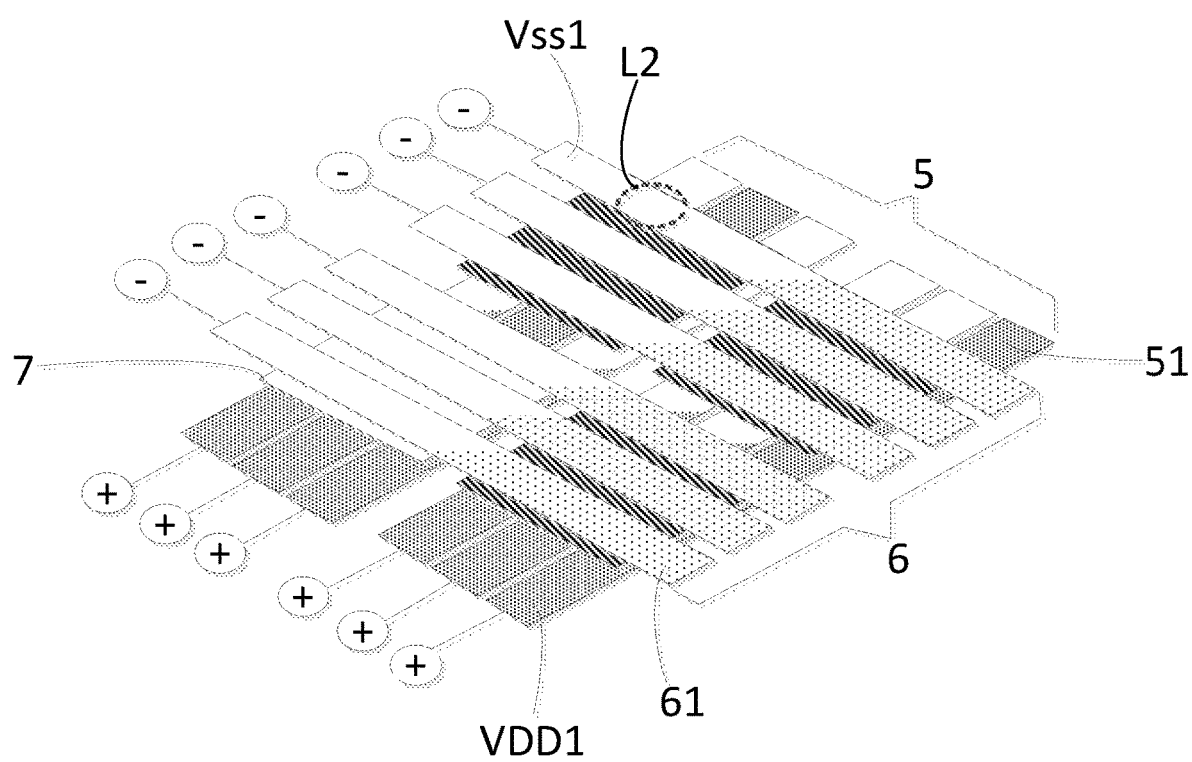
FIG. 3 is a schematic structural diagram of the second light emitting devices of the second sub-pixel units in a second display area provided by an embodiment of the present disclosure.
Figure 4:
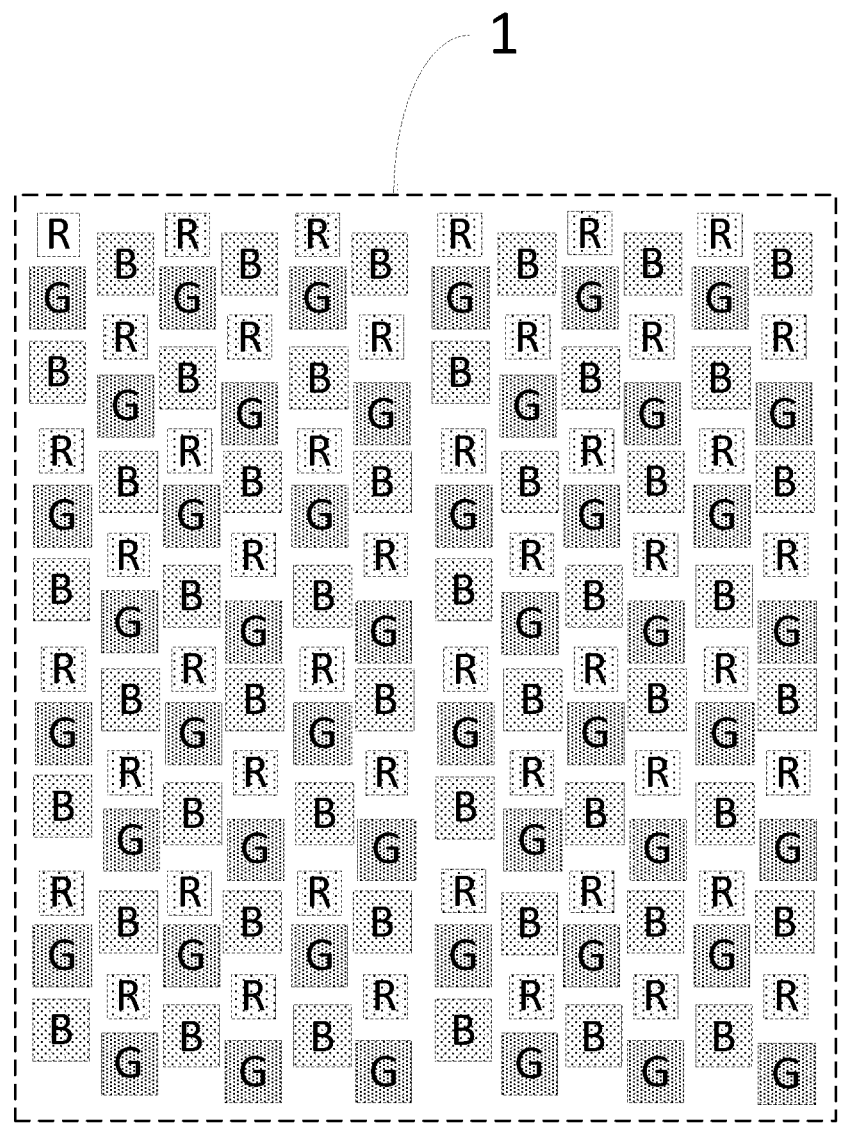
FIG. 4 is a schematic structural diagram of arrangement of the first sub-pixel units in the first display area provided by an embodiment of the present disclosure.
Figure 5:
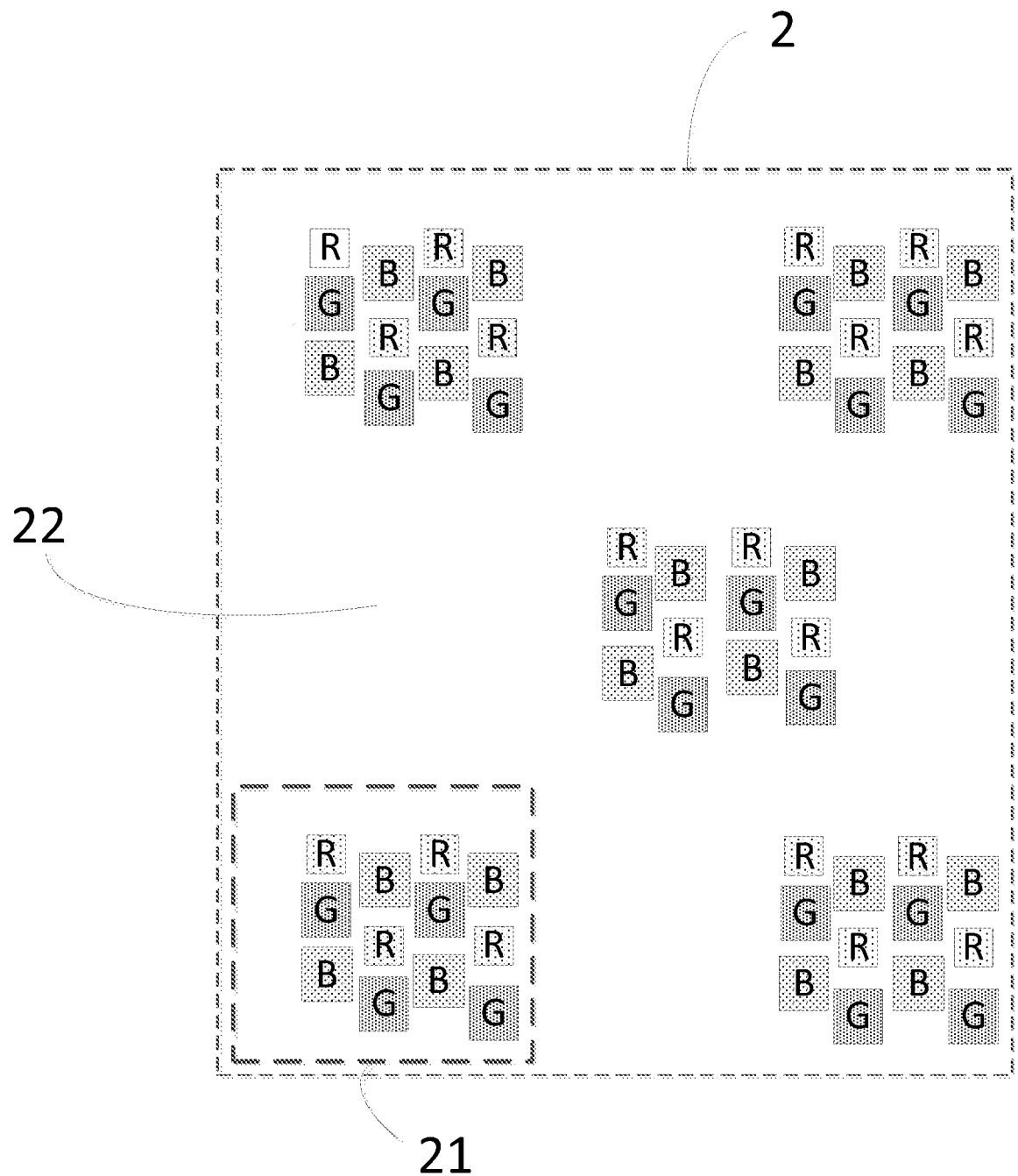
FIG. 5 is a schematic structural diagram of arrangement of the second sub-pixel units in the second display area provided by an embodiment of the present disclosure.

A display panel provided by an embodiment of the present disclosure, as shown in FIG. 1, includes a display area; the display area includes a first display area 1 and a second display area 2. As shown in FIG. 4, the first display area 1 includes a plurality of first sub-pixel units (such as R, G and B). As shown in FIG. 2, each of the first sub-pixel units includes a first light emitting device L1 and a driving circuit 3 for driving the first light emitting device L1 to emit light, namely FIG. 2 only schematically shows structures of the driving circuit 3 and the first light emitting device L1 of each of the first sub-pixel units. As shown in FIG. 3 and FIG. 5, the second display area 2 includes a plurality of second sub-pixel units (such as R, G and B) and a plurality of first voltage signal lines VDD1, FIG. 5 is a schematic diagram of arrangement of the plurality of second sub-pixel units in the second display area 2, FIG. 3 is structures of a plurality of second light emitting device L2 corresponding to the second sub-pixel units of array distribution as shown in FIG. 5, namely each of the second sub-pixel units includes one of the second light emitting device L2, and the first voltage signal lines VDD1 are directly and electrically connected to anodes of the second light emitting devices L2.

According to the above-mentioned display panel provided by the embodiment of the present disclosure, as shown in FIG. 1, FIG. 2 and FIG. 4, the first display area 1 includes the plurality of first sub-pixel units (such as R, G and B), each of the first sub-pixel units includes the first light emitting device L1 and the driving circuit 3 for driving the first light emitting device L1 to emit light, namely the first light emitting device L1 in the first display area 1 adopts independent thin film transistors in the driving circuit 3 to control each of the first sub-pixel units to emit light, in other words, active matrix light emission is adopted as a driving light emission way in the first display area 1, namely the display panel in the first display area 1 is of an active matrix organic light-emitting diode (AMOLED) structure. As shown in FIG. 1, FIG. 3 and FIG. 5, the second display area 2 includes the plurality of second sub-pixel units (such as R, G and B) and the plurality of first voltage signal lines VDD1, each of the second sub-pixel units includes the second light emitting device L2, and the first voltage signal lines VDD1 are directly and electrically connected to the anodes of the second light emitting devices L2, namely the second light emitting devices L2 in the second display area 2 are shaped like a matrix simply composed of a cathode layer 6 and an anode layer 5, to light the second sub-pixel units in an array in a scanning way; in other words, passive matrix light emission is adopted as a driving light emission way in the second display area 2, namely the display panel in the second display area 2 is of a passive matrix organic light-emitting diode (PMOLED) structure. The AMOLED structure includes thin film transistor structures with more metal layers, while the PMOLED structure is adopted in the second display area 2 in the present disclosure, and the PMOLED structure is only provided with two metal layers including the cathode layer 6 and the anode layer 5 instead of the metal layers in the thin film transistor structure, so that the transmittance in the second display area 2 may be increased, and the problem of relatively low transmittance in an area of a display panel corresponding to device structures such as a camera and an infrared sensor in the prior art is solved.

During specific implementation, in the above-mentioned display panel provided by the embodiment of the present disclosure, a pixel density of the first sub-pixel units is larger than that of the second sub-pixel units. Specifically, as shown in FIG. 4 and FIG. 5, FIG. 4 is a schematic structural diagram of arrangement of the first sub-pixel units (such as a red sub-pixel R unit, a green sub-pixel G unit and a blue sub-pixel B unit), and FIG. 5 is a schematic structural diagram of arrangement of the second sub-pixel units (such as a red sub-pixel R unit, a green sub-pixel G unit and a blue sub-pixel B unit) in the second display area 2. In this way, the transmittance in the second display area 2 may be further increased, to improve the photosensitive effect of photosensitive device structures such as a camera and an infrared sensor arranged at the back of the display panel corresponding to the second display area 2.

During specific implementation, in order to further increase the transmittance in the second display area, in the above-mentioned display panel provided by the embodiment of the present disclosure, as shown in FIG. 5, the plurality of second sub-pixel units (such as the red sub-pixel R unit, the green sub-pixel G unit and the blue sub-pixel B unit) constitute a plurality of sub-display areas 21, and a light transmitting area 22 is arranged between every two adjacent sub-display areas 21. In this way, a pure light transmission area 22 may be formed in the second display area 2, and the photosensitive device structures such as the camera and the infrared sensor are arranged at the back of the display panel corresponding to the second display area 2, so that not only may full-screen display be realized, but also the transmittance in the second display area 2 may be increased.

During specific implementation, in the above-mentioned display panel provided by the embodiment of the present disclosure, as shown in FIG. 2, the first display area 1 further includes a plurality of second voltage signal lines VDD2, the second voltage signal lines VDD2 are electrically connected to anodes 4 of the first light emitting devices L1 through the driving circuits 3. as shown in FIG. 3, the second display area 2 includes the anode layer 5, a light emitting functional layer 7 and the cathode layer 6 stacked in sequence; the anode layer 5 includes a plurality of first strip electrodes 51 extending in a first direction and being arranged in a second direction, and the cathode layer 6 includes a plurality of second strip electrodes 61 extending in the second direction and being arranged in the first direction. Overlapped areas of the first strip electrodes 51, the light emitting functional layer 7 and the second strip electrodes 61 constitute the second light emitting devices L2; parts, located in the overlapped areas, in the anode layer 5, serve as the anodes of the second light emitting devices L2, and non-overlapped parts in the anode layer 5 serve as voltage signal lines (namely the first voltage signal lines VDD1) of the anode layer 5; parts, located in the overlapped areas, in the cathode layer 6, serve as cathodes of the second light emitting devices L2, and non-overlapped parts in the cathode layer 6 serve as voltage signal lines VSS1 of the cathode layer 6; and the cathode layer 6 is made of a transparent conductive material. Specifically, the cathode layer 6 is made of the transparent conductive material, so that the transmittance in the second display area 2 may be further increased.

During specific implementation, as shown in FIG. 3, the PMOLED structure is adopted in the second display area 2, the PMOLED is shaped like a matrix simply composed of the second strip electrodes 61 and the first strip electrodes 51 and is directly and electrically connected to voltage signal lines VSS1, to light the second sub-pixel units in the matrix in a scanning way, each of the second sub-pixel units is operated under a short-pulse mode to instantly emit light with high brightness. The PMOLED has the advantage of simple structure, only has the two metal layers including the anode layer and the cathode layer, and may be used to be fabricated in a display area with high transmittance, namely the second display area, so that the photosensitive device structures such as the camera and the infrared sensor are arranged at the back of the display panel corresponding to the second display area.

During specific implementation, in order to obtain the transmittance as high as possible in the second display area, in the above-mentioned display panel provided by the embodiment of the present disclosure, the transparent conductive material of the cathode layer in the second display area may be indium zinc oxide (IZO) instead of a traditional Mg/Ag material. The transmittance of the IZO material to visible light and infrared light reaches up to about 90%, while the transmittance of the Mg/Ag material to the visible light and the infrared light is about 50%, and therefore, the transmittance in the second display area is greatly increased by IZO.

During specific implementation, in the above-mentioned display panel provided by the embodiment of the present disclosure, the anode layer in the second display area may be made of indium tin oxide (ITO)/Ag.

During specific implementation, in the above-mentioned display panel provided by the embodiment of the present disclosure, the cathodes of the first light emitting devices may be made of Mg/Ag, and the anodes of the first light emitting devices may be made of ITO/Ag.

During specific implementation, in the above-mentioned display panel provided by the embodiment of the present disclosure, a shape of the second display area includes any one or a combination of a round, an ellipse or a square.

During specific implementation, in the above-mentioned display panel provided by the embodiment of the present disclosure, the shape of the second display area may be the round, the ellipse or the square in the above-mentioned embodiment, or any one combined shape or irregular shape, and is selected according to an actual use condition during specific use.

During specific implementation, the above-mentioned display panel provided by the embodiment of the present disclosure is an organic light emitting display panel. The driving circuit, used for driving the first light emitting device to emit light, of each of the first sub-pixel units in the first display area may adopt a driving circuit 3, including seven thin film transistors T1-T7 and one storage capacitor 7T1C, as shown in FIG. 2. Of course, the driving circuit may also adopt any other circuit structures capable of driving the first light emitting device to emit light, the limitations thereof are omitted herein.

Based on the same inventive concept, an embodiment of the present disclosure further provides a display device including the above-mentioned display panel provided by the embodiment of the present disclosure. The principle that the display device solves problems is similar to that of the above-mentioned display panel, and therefore, the implementation of the display device may refer to that of the above-mentioned display panel, and the descriptions thereof are omitted herein.

Figure 6:
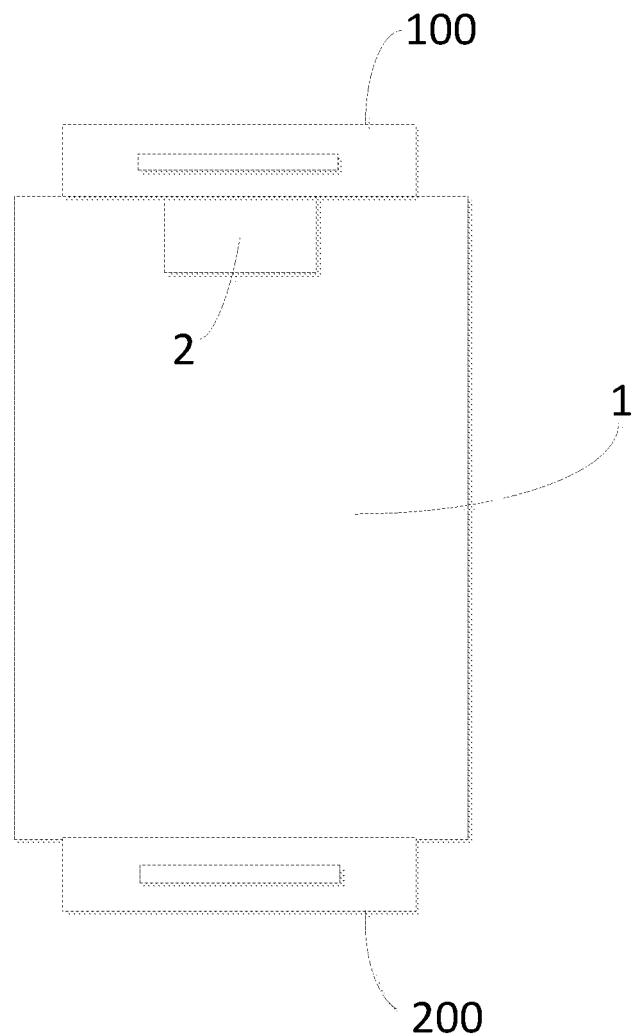
FIG. 6 is a schematic structural diagram of a display device provided by an embodiment of the present disclosure.

During specific implementation, the above-mentioned display device provided by the embodiment of the present disclosure, as shown in FIG. 6, further includes a first driving IC 100 electrically connected to the first voltage signal lines and a second driving IC 200 electrically connected to the second voltage signal lines, where the first driving IC 100 is configured to directly input current signals to the anodes (unshown in FIG. 6) of second light emitting devices through the first voltage signal lines (unshown in FIG. 6), and the second driving IC 200 is configured to input current signals to anodes (unshown in FIG. 6) of first light emitting devices sequentially through the second voltage signal lines (unshown in FIG. 6) and the driving circuits (unshown in FIG. 6). Different driving ways are adopted in the first display area and the second display area of the display device provided by the embodiment of the present disclosure, in this way, the different driving ICs may be respectively adopted in the first display area and the second display area to input voltage signals to the respective corresponding display areas.

During specific implementation, in the above-mentioned display device provided by the embodiment of the present disclosure, as shown in FIG. 6, the first driving IC 100 and the second driving IC 200 are arranged at two opposite sides of the display panel.

During specific implementation, the above-mentioned display device provided by the embodiment of the present disclosure further includes a sensor module, where the sensor module is arranged in the second display area of the display panel and is arranged at a backlight side of the display panel, and a photosensitive surface of the sensor module faces the display panel.

Specifically, the sensor module may include components such as a camera, an infrared sensor, an earphone.

During specific implementation, the above-mentioned display device provided by the embodiment of the present disclosure is a full-screen display device.

Figure 7:
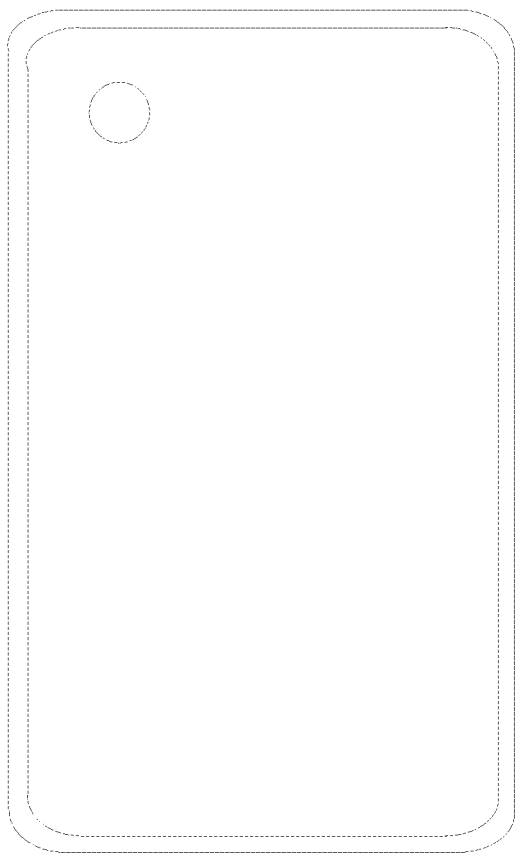
FIG. 7 is a schematic structural diagram of another display device provided by an embodiment of the present disclosure.

During specific implementation, the above-mentioned display device provided by the embodiment of the present disclosure may be a full-screen mobile phone as shown in FIG. 7. Of course, the above-mentioned display device provided by the embodiment of the present disclosure may also be any product or component with a display function, such as a tablet personal computer, a television, a display, a notebook computer, a digital photo frame and a navigator. Other essential components for the display device are regarded to be provided by those of ordinary skill in the art, the descriptions thereof are omitted herein and should not be regarded as limitations to the present disclosure.

According to the display panel and display device provided by the embodiments of the present disclosure, the first display area of the display panel includes the plurality of first sub-pixel units, each of the first sub-pixel units includes the first light emitting device and the driving circuit for driving the first light emitting device to emit light, namely the first light emitting device in the first display area adopts independent thin film transistors in the driving circuit to control each of the first sub-pixel units to emit light, in other words, active matrix light emission is adopted as a driving light emission way in the first display area, namely the display panel in the first display area is of an AMOLED structure. The second display area includes the plurality of second sub-pixel units and the plurality of first voltage signal lines, each of the second sub-pixel units includes the second light emitting device, and the first voltage signal lines are directly and electrically connected to the anodes of the second light emitting devices, namely the second light emitting devices in the second display area are shaped like a matrix simply composed of the cathode layer and the anode layer, to light the second sub-pixel units in an array in a scanning way, in other words, passive matrix light emission is adopted as a driving light emission way in the second display area, namely the display panel in the second display area is of a PMOLED structure. The AMOLED structure includes thin film transistor structures with more metal layers, while the PMOLED structure is adopted in the second display area in the present disclosure, and the PMOLED structure is only provided with two metal layers including the cathode layer and the anode layer instead of the metal layers in the thin film transistor structures, so that the transmittance in the second display area may be increased, and the problem of relatively low transmittance in an area of a display panel corresponding to device structures such as a camera and an infrared sensor in the prior art is solved.

Obviously, those skilled in the art can make various alterations and variations on the present disclosure without departing from the spirit and scope of the present disclosure. In this way, if these alterations and variations of the present disclosure fall within the scopes of the claims and the equivalent technologies of the present disclosure, the present disclosure is also intended to include the alterations and variations.

What is claimed is:

1. A display panel comprising:
a first display area; and
a second display area;
wherein the first display area comprises:
a plurality of first sub-pixel units;
wherein each of the first sub-pixel units comprises:
a first light emitting device; and
a driving circuit for driving the first light emitting device to emit light;
wherein the second display area comprises:
a plurality of second sub-pixel units; and
a plurality of first voltage signal lines;
wherein each of the second sub-pixel units comprises:
a second light emitting device; and
wherein the first voltage signal lines are directly and electrically connected to anodes of the second light emitting devices;
wherein the plurality of second sub-pixel units constitute a plurality of sub-display areas, and a light transmitting area is arranged between every two adjacent sub-display areas.

2. The display panel of claim 1, wherein a pixel density of the first sub-pixel units is larger than that of the second sub-pixel units.

3. The display panel of claim 1, wherein the first display area further comprises a plurality of second voltage signal lines, and the second voltage signal lines are electrically connected to anodes of the first light emitting devices through the driving circuits;
wherein the second display area comprises an anode layer, a light emitting functional layer and a cathode layer stacked in sequence;
the anode layer comprises a plurality of first strip electrodes extending in a first direction and being arranged in a second direction, and the cathode layer comprises a plurality of second strip electrodes extending in the second direction and being arranged in the first direction;
overlapped areas of the first strip electrodes, the light emitting functional layer and the second strip electrodes constitute the second light emitting devices;
parts, arranged in the overlapped areas, in the anode layer, serve as the anodes of the second light emitting devices, and non-overlapped parts in the anode layer serve as the first voltage signal lines;
parts, arranged in the overlapped areas, in the cathode layer, serve as cathodes of the second light emitting devices, and non-overlapped parts in the cathode layer serve as voltage signal lines of the cathode layer; and
the cathode layer is made of a transparent conductive material.

4. The display panel of claim 3, wherein the transparent conductive material is indium zinc oxide (IZO).

5. The display panel of claim 3, wherein the anode layer is made of indium tin oxide (ITO) or Ag.

6. The display panel of claim 1, wherein a shape of the second display area comprises any one or a combination of a round, an ellipse or a square.

7. A display device, comprising the display panel of claim 1.

8. The display device of claim 7, further comprising a first driving IC electrically connected to the first voltage signal lines and a second driving IC electrically connected to second voltage signal lines,
wherein the first driving IC is configured to directly input current signals to the anodes of second light emitting devices through the first voltage signal lines, and the second driving IC is configured to input current signals to anodes of first light emitting devices sequentially through the second voltage signal lines and the driving circuits.

9. The display device of claim 8, wherein the first driving IC and the second driving IC are arranged at two opposite sides of the display panel.

10. The display device of claim 7, further comprising a sensor module, wherein the sensor module is arranged in the second display area of the display panel and is arranged at a backlight side of the display panel, and a photosensitive surface of the sensor module faces the display panel.

* * * * *